United States Patent
Hwang et al.

(10) Patent No.: US 11,515,368 B2
(45) Date of Patent: Nov. 29, 2022

(54) ORGANIC LIGHT EMITTING DISPLAY DEVICE AND ELECTRONIC DEVICE INCLUDING THE SAME

(71) Applicant: Samsung Display Co., Ltd., Yongin-Si (KR)

(72) Inventors: Hyun-Been Hwang, Suwon-si (KR); Yong Chan Jeon, Cheonan-si (KR); Chul Ho Jeong, Seoul (KR); Cheol Ho Choi, Asan-si (KR); Hirotsugu Kishimoto, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/077,440

(22) Filed: Oct. 22, 2020

(65) Prior Publication Data
US 2021/0249480 A1  Aug. 12, 2021

(30) Foreign Application Priority Data
Feb. 10, 2020 (KR) .................. 10-2020-0015446

(51) Int. Cl.
*G06F 3/01* (2006.01)
*H01L 27/32* (2006.01)
*H01L 51/00* (2006.01)
*G06F 3/041* (2006.01)

(52) U.S. Cl.
CPC ............ *H01L 27/323* (2013.01); *G06F 3/016* (2013.01); *G06F 3/0412* (2013.01); *H01L 51/0097* (2013.01); *G06F 2203/04102* (2013.01); *G06F 2203/04105* (2013.01)

(58) Field of Classification Search
None
See application file for complete search history.

(56) References Cited

U.S. PATENT DOCUMENTS

| | | |
|---|---|---|
| 8,830,212 B2 | 9/2014 | Vaganov |
| 10,638,618 B1* | 4/2020 | Teil ...................... H03K 17/955 |
| 2010/0050779 A1* | 3/2010 | Pushparaj ................. G01L 1/20 |
| | | 73/774 |
| 2017/0364167 A1 | 12/2017 | Ribeiro et al. |
| 2019/0102018 A1* | 4/2019 | Qin ........................ G06F 3/0443 |
| 2020/0371634 A1* | 11/2020 | Maekawa .............. G06F 3/0414 |

* cited by examiner

*Primary Examiner* — Brian M Butcher
(74) *Attorney, Agent, or Firm* — Cantor Colburn LLP

(57) ABSTRACT

An organic light emitting display device includes a lower electrode, a pressure sensing layer disposed on the lower electrode, an upper electrode disposed on the pressure sensing layer, an organic light emitting structure disposed on the upper electrode, a window disposed on the organic light emitting structure and which is applied with a user pressure, and a haptic structure which generates a haptic signal when the user pressure detected through the lower electrode, the pressure sensing layer, and the upper electrode is greater than a predetermined pressure.

16 Claims, 10 Drawing Sheets

ORGANIC LIGHT EMITTING DISPLAY DEVICE AND ELECTRONIC DEVICE INCLUDING THE SAME

This application claims priority to Korean Patent Application No. 10-2020-0015446, filed on Feb. 10, 2020, and all the benefits accruing therefrom under 35 U.S.C. § 119, the content of which in its entirety is herein incorporated by reference.

BACKGROUND

1. Technical Field

Example embodiments relate generally to an organic light emitting display device and an electronic device including the same.

2. Description of the Related Art

Since an organic light emitting display device does not require a separate backlight unit, the organic light emitting display device may be implemented thinner than a conventional display device. A foldable organic light emitting display device, a rollable organic light emitting display device, and the like have been developed by utilizing a thin thickness of the organic light emitting display device. Generally, the organic light emitting display device includes a window including a plastic material to secure flexibility.

SUMMARY

However, compared to a window including a glass, the window including the plastic material may be easily damaged due to a user pressure exerted by a user. When the window is damaged, internal components of the organic light emitting display device disposed under the window may be damaged. Some example embodiments provide an organic light emitting display device capable of preventing damage to internal components due to an excessive user pressure.

Some example embodiments provide an electronic device including the organic light emitting display device and an input unit.

Some example embodiments provide a method of operating the organic light emitting display device.

According to an aspect of an example embodiment, an organic light emitting display device includes a lower electrode, a pressure sensing layer disposed on the lower electrode, an upper electrode disposed on the pressure sensing layer, an organic light emitting structure disposed on the upper electrode, a window disposed on the organic light emitting structure and which is applied with a user pressure, and a haptic structure which generates a haptic signal when the user pressure detected through the lower electrode, the pressure sensing layer, and the upper electrode is greater than a predetermined pressure.

In an example embodiment, the pressure sensing layer may be a dielectric layer including a dielectric material.

In an example embodiment, the organic light emitting display device may further include a first lower substrate disposed between the dielectric layer and the upper electrode, and the first lower substrate may be adhered to the lower electrode using the dielectric material included in the dielectric layer.

In an example embodiment, a capacitance may be generated in the dielectric layer by the lower electrode and the upper electrode, and the capacitance may change based on a magnitude of the user pressure applied to the window.

In an example embodiment, each of the upper and lower electrodes may have a plate shape.

In an example embodiment, the lower electrode may include a plurality of auxiliary lower electrodes extending in a first direction and arranged spaced apart in a second direction intersecting the first direction, and the upper electrode may include a plurality of auxiliary upper electrodes extending in the second direction and arranged spaced apart in the first direction.

In an example embodiment, each of the upper and lower electrodes may be disposed in a matrix shape.

In an example embodiment, the lower electrode and the upper electrode may overlap each other in a thickness direction of the dielectric layer.

In an example embodiment, the pressure sensing layer may be a resistance layer including a resistant material, and an electrical resistance of the resistant material may change based on a magnitude of the user pressure.

In an example embodiment, the organic light emitting display device may further include a second lower substrate disposed between the resistance layer and the upper electrode and defining a plurality of holes and an adhesive layer disposed between the second lower substrate and the resistance layer.

In an example embodiment, the adhesive layer may contact the upper electrode through the holes.

In an example embodiment, the adhesive layer may be an anisotropic conductive film.

In an example embodiment, the electrical resistance of the resistance layer may decrease, as the magnitude of the user pressure applied to the window increases, and the electrical resistance of the resistance layer may increase, as the magnitude of the user pressure applied to the window decreases.

In an example embodiment, the resistant material may be a quantum tunneling composite ("QTC").

In an example embodiment, the organic light emitting display device may further include a touch sensor disposed on the organic light emitting structure and which detects a touch pressure applied to the window.

In an example embodiment, the organic light emitting display device may further include a lower substrate disposed between the pressure sensing layer and the upper electrode, a lower barrier layer disposed on the upper electrode, an upper substrate disposed on the lower barrier layer, and an upper barrier layer disposed on the upper substrate. The window may include a plastic material and flexible According to another aspect of an example embodiment, an electronic device includes an organic light emitting display device and an input unit. The organic light emitting display device includes a substrate, an organic light emitting structure disposed on the substrate, a transparent electrode disposed on the organic light emitting structure, and a window disposed on the transparent electrode and which is applied with a user pressure by the input unit. The input unit includes an input electrode which contacts the window and a haptic structure. The haptic structure generates a haptic signal when the user pressure, which is detected through the transparent electrode, the window, and the input electrode, is greater than a predetermined pressure.

In an example embodiment, a capacitance may be generated in the window by the transparent electrode and the input electrode, and the capacitance may change based on a magnitude of the user pressure applied to the window.

According to still another aspect of an example embodiment, a method of operating an organic light emitting display device includes detecting, at the pressure sensor, a user pressure applied to the organic light emitting display device by an input unit, performing, at the organic light emitting display device, an operation based on the user pressure detected by the pressure sensor when the user pressure is less than or equal to a predetermined pressure, and providing a haptic signal generated by the haptic structure when the user pressure is greater than the predetermined pressure.

In an example embodiment, the organic light emitting display device may not perform the operation when user pressure is greater than the predetermined pressure.

Therefore, an organic light emitting display device according to example embodiments may inform a user when a user pressure is greater than a predetermined pressure. In detail, when the user pressure is greater than the predetermined pressure, a haptic structure of the organic light emitting display device may generate a haptic signal, and the organic light emitting display device may not perform an operation based on the user pressure. Accordingly, the user can reduce the user pressure applied to the organic light emitting display device of user's own accord. Therefore, damage to the organic light emitting display device, which is due to the user pressure greater than the predetermined pressure, may be effectively prevented.

The electronic device according to example embodiments may include the organic light emitting display device and an input unit. The electronic device may inform the user when the user pressure, which is applied to the organic light emitting display device by the input unit, is greater than the predetermined pressure. In detail, when the user pressure is greater than the predetermined pressure, the haptic structure of the organic light emitting display device may generate the haptic signal, and the organic light emitting display device may not perform the operation based on the user pressure. Accordingly, the user can reduce the user pressure applied to the organic light emitting display device of user's own accord. Therefore, the damage to the organic light emitting display device, which is due to the user pressure greater than the predetermined pressure, may be effectively prevented.

BRIEF DESCRIPTION OF THE DRAWINGS

Illustrative, non-limiting example embodiments will be more clearly understood from the following detailed description in conjunction with the accompanying drawings.

DETAILED DESCRIPTION

Hereinafter, embodiments of the present inventive concept will be explained in detail with reference to the accompanying drawings. It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 1:
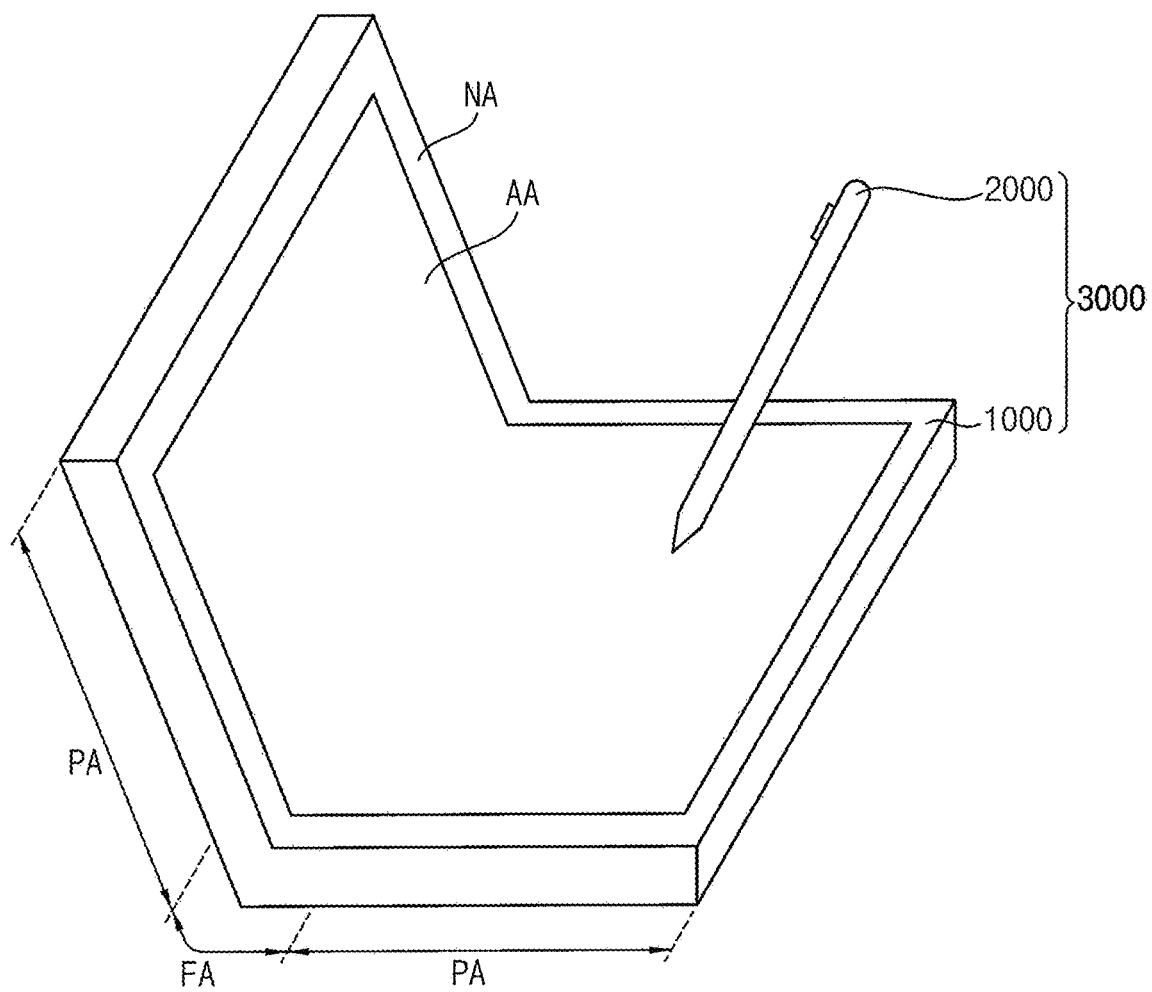
FIG. 1 is a diagram illustrating an electronic device according to example embodiments.
Figure 2:
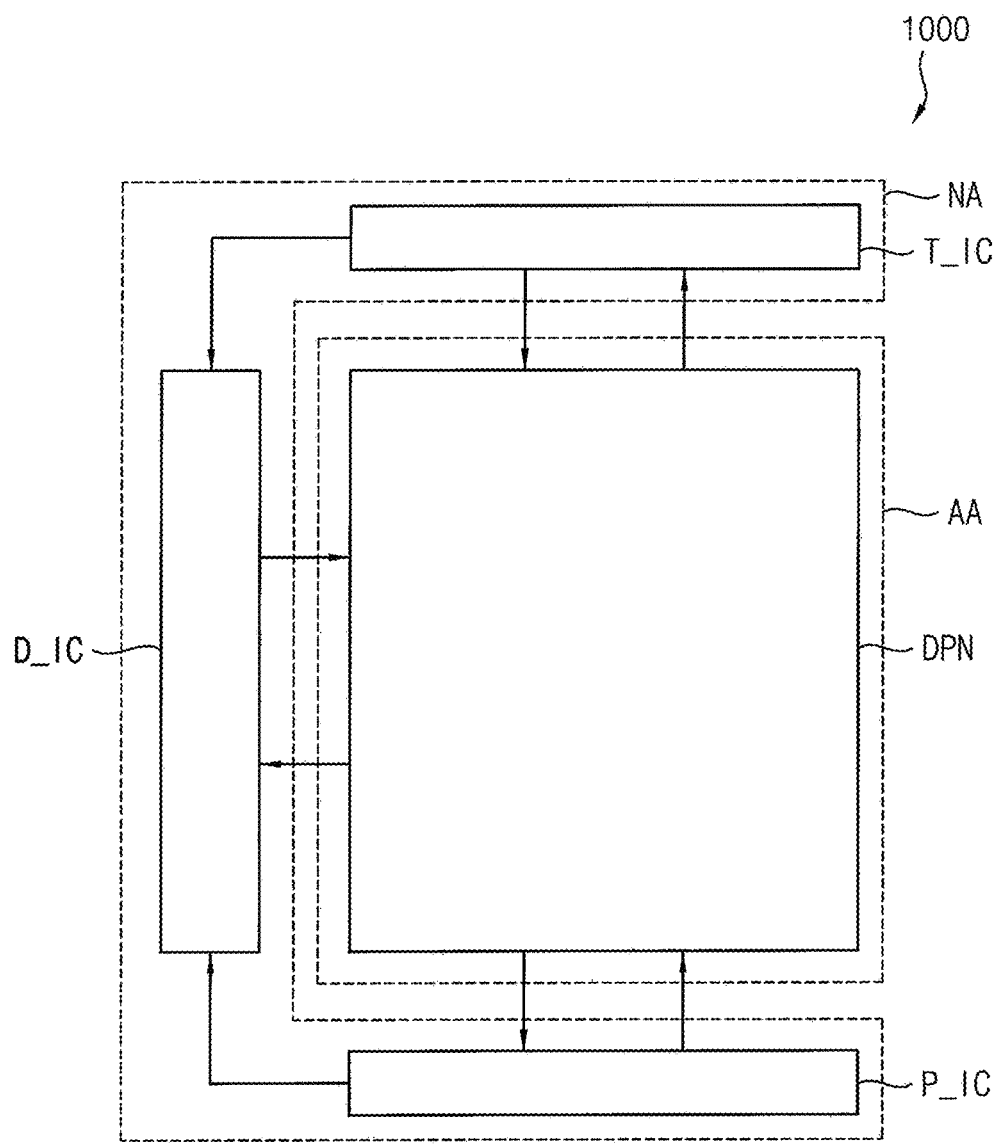
FIG. 2 is a block diagram illustrating an organic light emitting display device included in the electronic device of FIG. 1.
Figure 3:
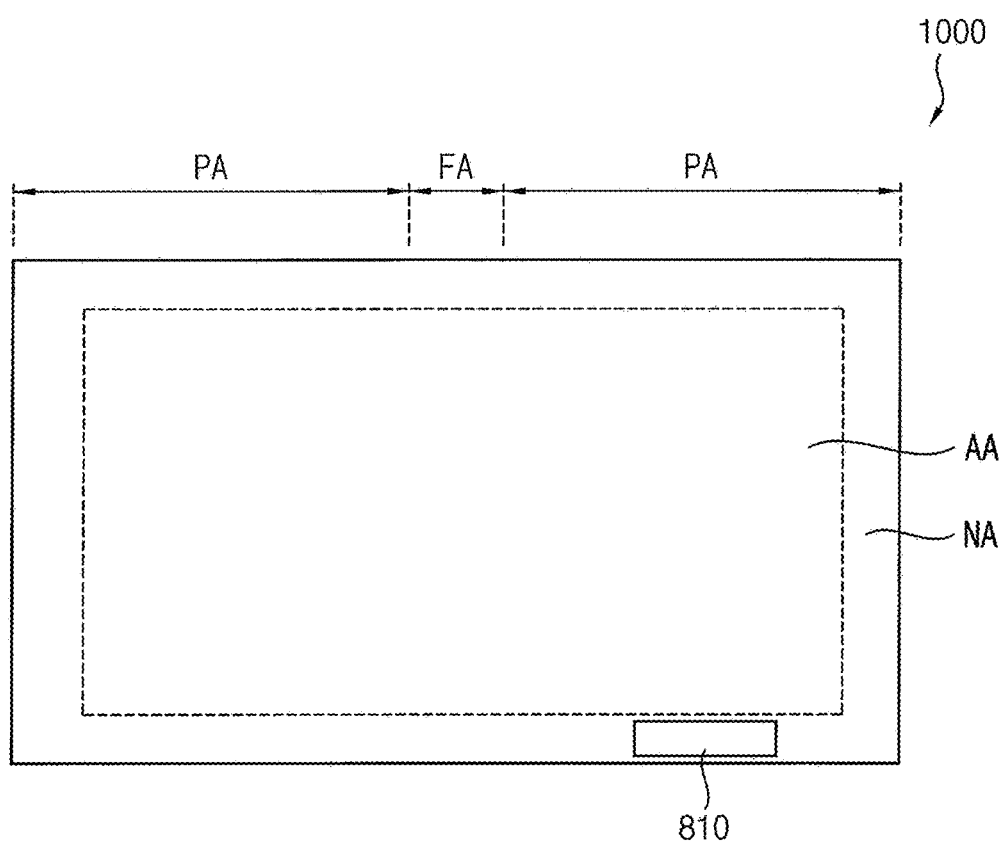
FIG. 3 is a plan view illustrating an example of an organic light emitting display device included in the electronic device of FIG. 1.

FIG. 1 is a diagram illustrating an electronic device according to example embodiments. FIG. 2 is a block diagram illustrating an organic light emitting display device included in the electronic device of FIG. 1. FIG. 3 is a plan view illustrating an organic light emitting display device included in the electronic device of FIG. 1.

Referring to FIGS. 1, 2, and 3, an electronic device 3000 according to example embodiments may include an organic light emitting display device 1000 and an input unit 2000. A user may apply a user pressure to the organic light emitting display device 1000 using the input unit 2000, and the organic light emitting display device 1000 may perform an operation based on the user pressure applied by the input unit 2000. The input unit 2000 may include any means that the user can use to apply the user pressure. In an example embodiment, the input unit 2000 may be an electrostatic stylus pen that includes an input electrode (e.g., an input electrode 190 of FIG. 12).

The organic light emitting display device 1000 may be divided into an active area AA and an inactive area NA. For example, as shown in FIG. 1, the organic light emitting display device 1000 may be divided into the active area AA and the inactive area NA surrounding the active area AA.

A display panel DPN, a touch sensor (e.g., a touch sensor 500 of FIG. 5), and a pressure sensor (e.g., a pressure sensor 100_1 of FIG. 5) may be disposed in the active area AA of the organic light emitting display device 1000. A haptic structure 810, a driving circuit D_IC, a touch sensing circuit T_IC, and a pressure sensing circuit P_IC may be disposed in the inactive area NA of the organic light emitting display device 1000.

The haptic structure 810 may generate a haptic signal. The haptic signal may include any signals that can be recognized by the user's sense (e.g., tactile or visual). For example, the haptic signal may be a vibration signal or an optical signal.

For example, when the haptic signal is the vibration signal, the haptic structure 810 may generate the vibration signal so that the organic light emitting display device 1000 may be vibrated. Accordingly, the user may sense a vibration of the organic light emitting display device 1000. For example, the organic light emitting display device may further include a vibrating plate attached to the haptic structure 810 and transferring the vibration.

The haptic structure 810 may be disposed at a position capable of transmitting the haptic signal to the organic light emitting display device 1000. In an example embodiment, as shown in FIG. 3, the haptic structure 810 may be disposed on a bottom of (i.e., lower side) the organic light emitting display device 1000. In another example embodiment, the haptic structure 810 may be disposed on a side and/or a top (i.e., upper side) of the organic light emitting display device 1000.

In an example embodiment, the driving circuit D_IC, the touch sensing circuit T_IC, and a pressure sensing circuit P_IC may be directly mounted in the inactive area NA of the organic light emitting display device 1000. In another example embodiment, a flexible printed circuit board may be further disposed in the inactive area NA, and the driving circuit D_IC, the touch sensing circuit T_IC, and the pressure sensing circuit P_IC may be disposed on the flexible printed circuit board. In this case, the driving circuit D_IC, the touch sensing circuit T_IC, and the pressure sensing circuit P_IC may be disposed on one flexible printed circuit board. In another example embodiment, the driving circuit D_IC, the touch sensing circuit T_IC, and the pressure sensing circuit P_IC may be disposed on a plurality of the flexible printed circuit boards, respectively.

The display panel DPN may be provided with a driving signal from the driving circuit D_IC and may display an image. For display panel DPN to display the image, the display panel DPN may include an organic light emitting structure (e.g., an organic light emitting structure 400 in FIG. 5). For example, the driving signal may include a data voltage controlling a luminance of light emitted from the organic light emitting structure, a gate signal controlling turn-on and turn-off of the organic light emitting structure, an emitting control signal controlling emitting of the organic light emitting structure, a power provided to the organic light emitting structure, an initialization voltage, and so on.

The touch sensor may be provided with a touch driving signal from the touch sensing circuit T_IC and may detect a touch by the input unit 2000. In an example embodiment, the touch sensor may include a touch driving electrode provided with the touch driving signal and a touch sensing electrode forming a touch capacitance together with the touch driving electrode. In this case, the touch capacitance may change based on the touch by the input unit 2000, and the touch sensor may detect a change of the touch capacitance.

The pressure sensor may be provided with a pressure driving signal from the pressure sensing circuit P_IC and may detect the user pressure by the input unit 2000. In an example embodiment, the pressure sensor may include a pressure driving electrode provided with the pressure driving signal and a pressure sensing electrode forming a pressure capacitance together with the pressure driving electrode. In this case, the pressure capacitance may change based on a magnitude of the user pressure, and the pressure sensor may detect a change of the pressure capacitance. A structure of the pressure sensor may be described in detail with reference to FIGS. 6, 7, and 8.

The touch sensing circuit T_IC may generate a touch sensing signal according to the touch detected from the touch sensor. For example, the touch sensing circuit T_IC may generate the touch sensing signal according to the change of the touch capacitance detected from the touch sensor. The touch sensing signal may include information about whether the touch is made and a touch position.

The pressure sensing circuit P_IC may generate a pressure sensing signal according to the user pressure detected from the pressure sensor. For example, the pressure sensing circuit P_IC may generate the pressure sensing signal according to the change of the pressure capacitance detected from the pressure sensor. The pressure sensing signal may include information about the magnitude of the user pressure.

The driving circuit D_IC may be provided with the touch sensing signal from the touch sensing circuit T_IC and the pressure sensing signal from the pressure sensing circuit P_IC. The driving circuit D_IC may generate the driving signal based on the touch sensing signal and the pressure sensing signal.

In an example embodiment, the organic light emitting display device 1000 may also be divided into a folding area FA and flat areas PA. For example, as shown in FIG. 1, the organic light emitting display device 1000 may be divided into the flat areas PA and the folding area FA disposed between the flat areas PA. In an example embodiment, the active area AA may include the folding area FA.

Figure 4:
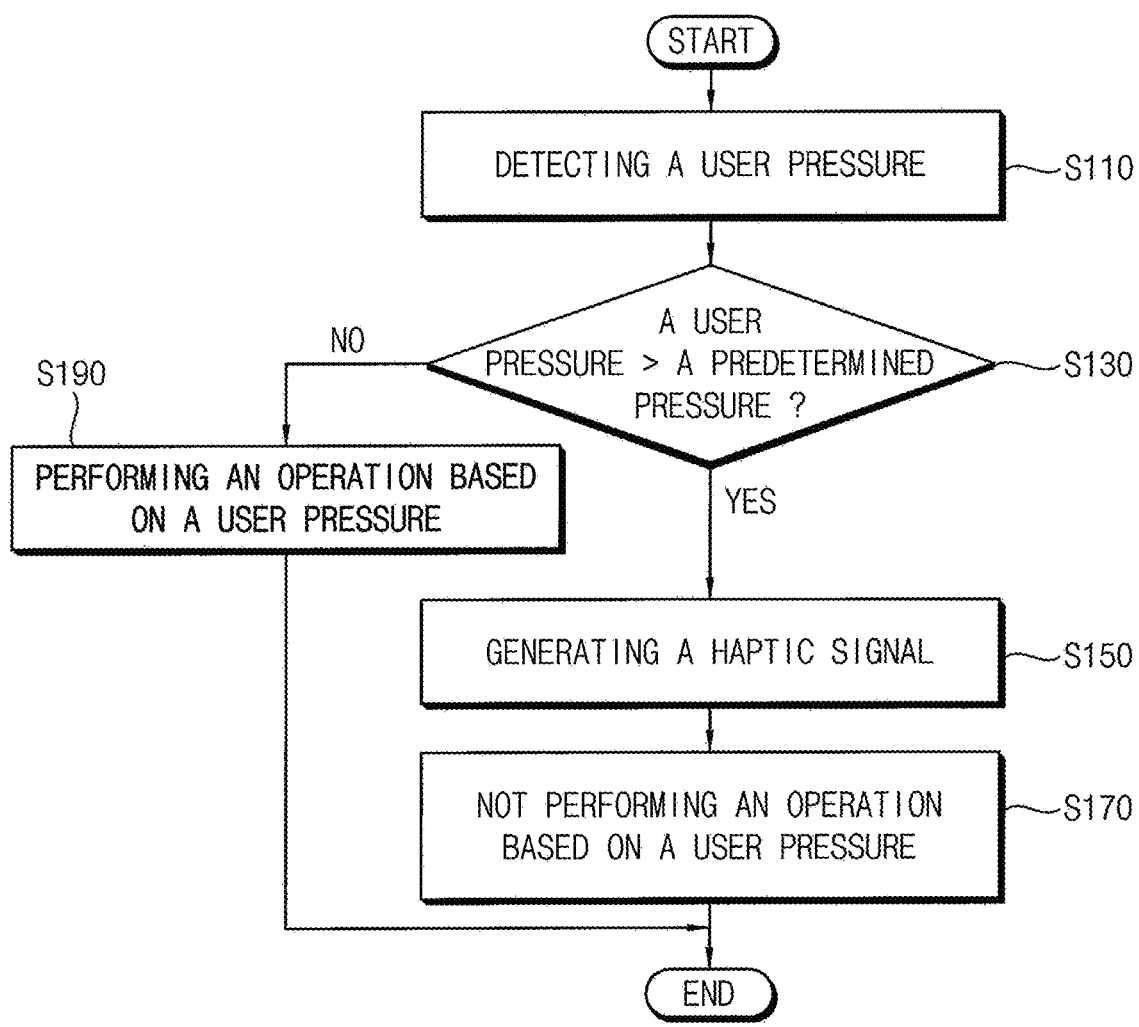
FIG. 4 is a flowchart illustrating a method of operating an organic light emitting display device included in the electronic device of FIG. 1.

FIG. 4 is a flowchart illustrating a method of operating an organic light emitting display device included in the electronic device of FIG. 1.

Referring to FIGS. 1, 2, 3, and 4, in the method of operating the organic light emitting display device 1000, the pressure sensor may detect the user pressure applied to the organic light emitting display device 1000 by the input unit 2000 (S110). For example, the pressure sensor may detect the change of the pressure capacitance by the input unit 2000, and the pressure sensing circuit P_IC may generate the pressure sensing signal based on the change of the pressure capacitance.

In the method of operating the organic light emitting display device 1000, when the user pressure is greater than a predetermined pressure (S130: YES), the haptic structure may generate the haptic signal (S150). In addition, the organic light emitting display device 1000 may not perform an operation based on the user pressure (S170). In detail, the driving circuit D_IC may be provided with the pressure sensing signal and the information about the magnitude of the user pressure included in the pressure sensing signal. The driving circuit D_IC may not generate the driving signal that would be generated if the user pressure were less than or equal to the predetermined pressure. Therefore, an image based on the user pressure is not displayed on the display panel DPN, when the user pressure is greater than the predetermined pressure.

In the method of operating the organic light emitting display device 1000, when the user pressure is less than or equal to the predetermined pressure (S130: NO), the organic light emitting display device 1000 may perform the operation based on the user pressure (S190). In detail, the driving circuit D_IC may be provided with the pressure sensing signal and the information about the magnitude of the user pressure included in the pressure sensing signal. The driving circuit D_IC may generate the driving signal so that an image based on the user pressure is displayed on the display panel DPN, when the user pressure is less than or equal to the predetermined pressure.

In the method of operating the organic light emitting display device 1000, the user pressure, which is applied to the organic light emitting display device 1000, by the input unit 2000 may be compared with the predetermined pressure. Thereafter, when the user pressure is greater than the predetermined pressure, the haptic structure 810 may generate the haptic signal, and the organic light emitting display device 1000 may not perform the operation based on the user pressure. Accordingly, the user can reduce the user pressure applied to the organic light emitting display device 1000 of user's own accord. Therefore, damage to the organic light emitting structure 400, which is due to the user pressure greater than the predetermined pressure, may be effectively prevented.

Figure 5:
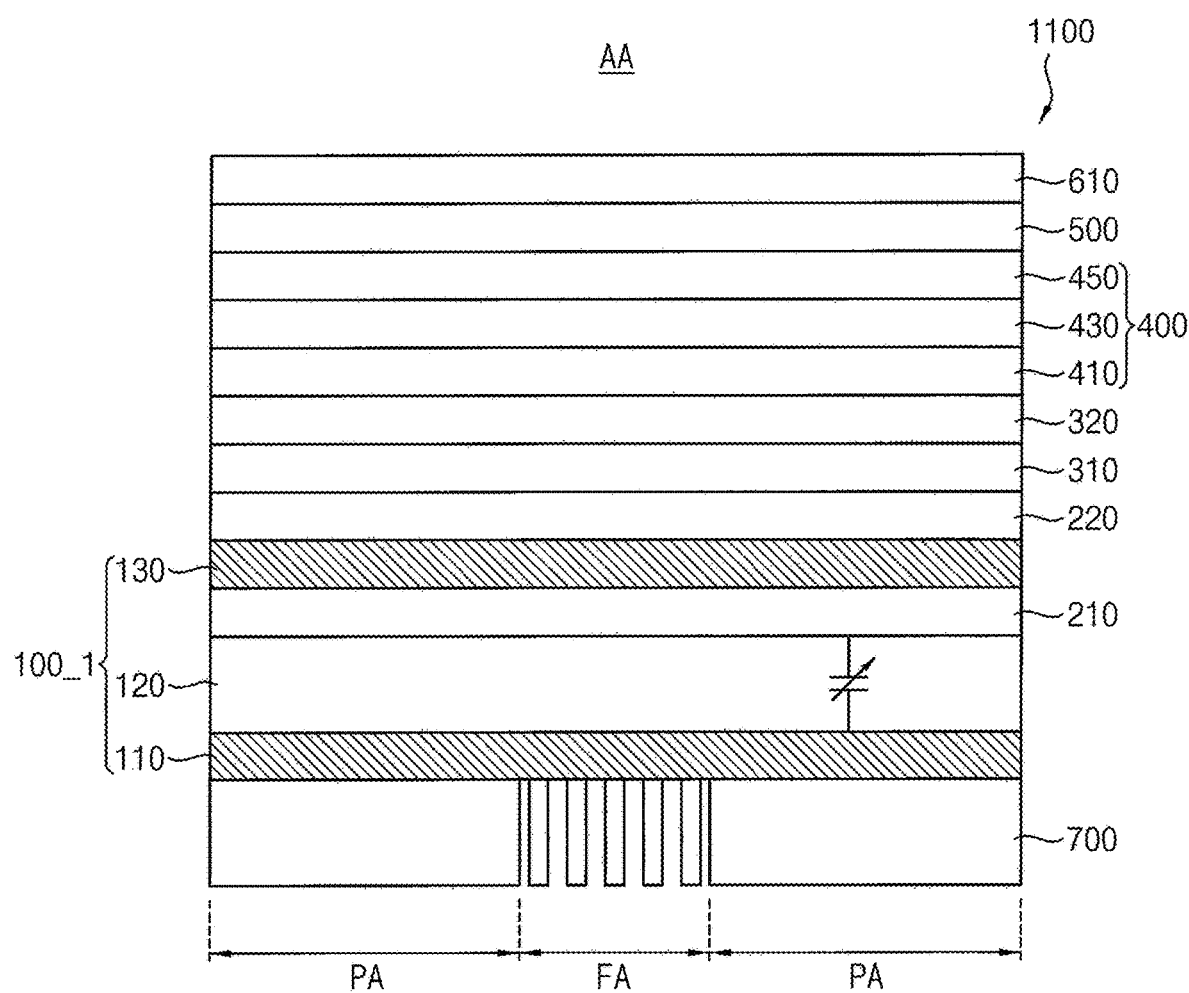
FIG. 5 is a cross-sectional view illustrating an example of an organic light emitting display device included in the electronic device of FIG. 1.
Figure 6:
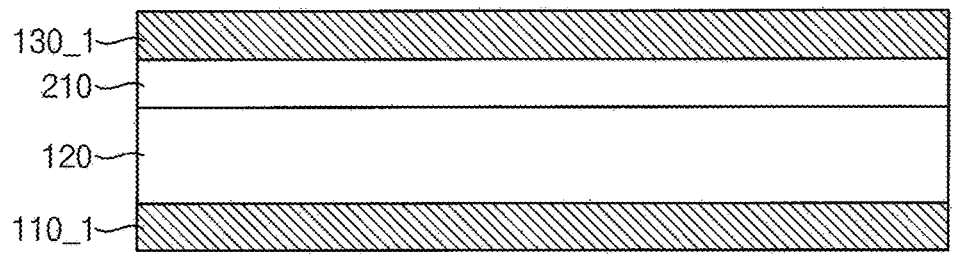
FIGS. 6, 7, and 8 are cross-sectional views illustrating examples of a pressure sensor having various lower electrodes and upper electrodes included in the organic light emitting display device of FIG. 5.
Figure 7:
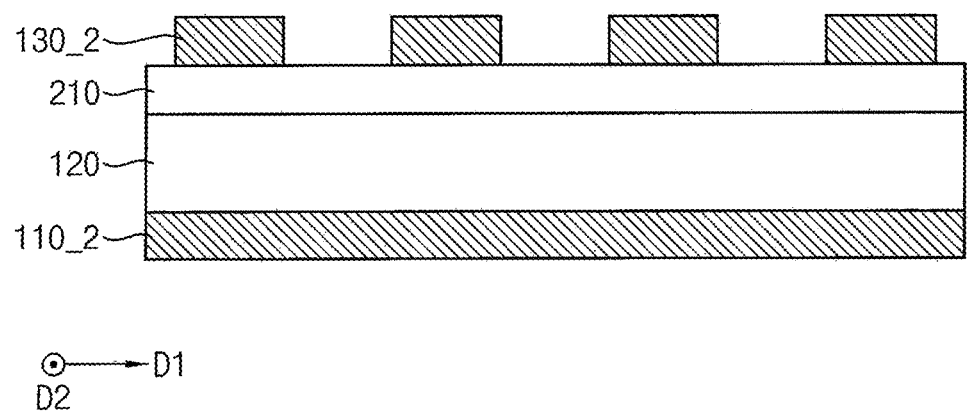
Figure 8:
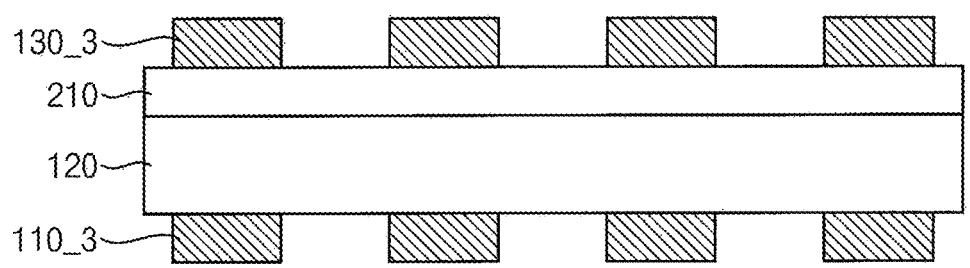

FIG. 5 is a cross-sectional view illustrating an example of an organic light emitting display device included in the electronic device of FIG. 1. FIGS. 6, 7, and 8 are cross-sectional views illustrating examples of the pressure sensor having various lower electrodes and upper electrodes included in the organic light emitting display device of FIG. 5.

Referring to FIGS. 1, 2, 3, and 5, an organic light emitting display device 1100 may include a pressure sensor 100_1, a first lower substrate 210, a lower barrier layer 220, an upper substrate 310, an upper barrier layer 320, an organic light emitting structure 400, a touch sensor 500, a window 610, and a support member 700. The pressure sensor 100_1 may include a lower electrode 110, a dielectric layer 120, and an upper electrode 130 and the organic light emitting structure 400 may include an element layer 410, an emission layer 430, and an encapsulation layer 450.

The pressure sensor 100_1 may detect the user pressure which is applied to the window 610, by the input unit 2000. For example, the pressure sensor 100_1 may include the lower electrode 110, the upper electrode 130, and the dielectric layer 120 disposed between the lower electrode 110 and the upper electrode 130.

The lower electrode 110 may be disposed on the support member 700. The lower electrode 110 may include a metal, an alloy, a metal nitride, a conductive metal oxide, a transparent conductive material, or the like. For example, the lower electrode 110 may include at least one of gold ("Au"), silver ("Ag"), aluminum ("Al"), platinum ("Pt"), nickel ("Ni"), titanium ("Ti"), palladium ("Pd"), magnesium ("Mg"), calcium ("Ca"), lithium ("Li"), Chromium ("Cr"), tantalum ("Ta"), molybdenum ("Mo"), scandium ("Sc"), neodymium ("Nd"), iridium ("Ir"), tungsten ("W"), tungsten nitride ("WNx"), titanium nitride ("TiNx"), tantalum Nitride ("TaNx"), strontium ruthenium oxide ("SrRuxOy"), zinc oxide ("ZnOx"), indium tin oxide ("ITO"), tin oxide ("SnOx"), indium oxide ("InOx")", gallium oxide ("GaOx"), indium zinc oxide ("IZO") and these alloys.

The dielectric layer 120 may be disposed on the lower electrode 110. The dielectric layer 120 may include a dielectric material to form the pressure capacitance. For example, the dielectric material may include at least one of silicon nitride, silicon oxide, air, membrane, plastic materials (e.g., polycarbonate, polyethylene terephthalate, or the like), optically clear adhesive ("OCA"), and pressure sensitive adhesive ("PSA"). In an example embodiment, the first lower substrate 210 may be adhered to the lower electrode 110 using the dielectric layer 120. For example, the dielectric material may include at least one of the OCA and the PSA.

The upper electrode 130 may be disposed on the dielectric layer 120. For example, the upper electrode 130 may include a substantially the same material as the lower electrode 110.

For example, the lower electrode 110 may be the pressure driving electrode, and the upper electrode 130 may be the pressure sensing electrode. In an example embodiment, the lower electrode 110 may be provided with the pressure driving signal from the pressure sensing circuit P_IC, and the upper electrode 130 may be provided with a ground voltage. In this case, the pressure sensor 100_1 may detect the user pressure in a self-capacitance method. In another example embodiment, the lower electrode 110 may be provided with the pressure driving signal, and the upper electrode 130 may be provided with the pressure sensing signal. In this case, the pressure sensor 100_1 may detect the user pressure in a mutual-capacitance method.

In an example embodiment, as shown in FIG. 6, each of the lower electrode 110_1 and the upper electrode 130_1 may be a plate shape. In another example embodiment, as shown in FIG. 7, the lower electrode 110_2 may include a plurality of auxiliary lower electrodes, and the upper electrode 130_2 may include a plurality of auxiliary upper electrodes. The auxiliary lower electrodes included in the lower electrode 110_2 may extend in a first direction DR1 and be arranged spaced apart in a second direction DR2 intersecting the first direction DR1. The auxiliary upper electrodes included in the upper electrode 130_2 may extend in the second direction DR2 and be arranged spaced apart in the first direction DR1. In still another example embodiment, as shown in FIG. 8, each of the lower electrode 110_3 and the upper electrode 130_3 may be disposed in a matrix shape. In this case, to form the pressure capacitance in the dielectric layer 120, the lower electrode 110_3 and the upper electrode 130_3 may overlap each other in the thickness direction of the dielectric layer 120.

The first lower substrate 210 may be disposed between the dielectric layer 120 and the upper electrode 130. The first lower substrate 210 may be a transparent or opaque substrate. In addition, the first lower substrate 210 may include at least one of a glass, a quartz, and a plastic material. In an example embodiment, the organic light emitting display device 1100 may include the folding area FA. In this case, the first lower substrate 210 may include a flexible plastic material so that the first lower substrate 210 is configured to be folded and unfolded in the folding area FA. For example, the first lower substrate 210 may include polyimide.

The lower barrier layer 220 may be disposed on the upper electrode 130. The lower barrier layer 220 may prevent a diffusion of metal atoms or impurities to the element layer 410 from the first lower substrate 210 and the upper electrode 130. In addition, the lower barrier layer 220 may control a heat transfer rate during a crystallization process for forming an active pattern included in the element layer 410 so that the active pattern is uniformly formed. For example, the lower barrier layer 220 may include silicon compounds such as silicon nitride, silicon oxide, silicon oxynitride, silicon oxycarbide, and silicon carbonitride.

The upper substrate 310 may be disposed on the lower barrier layer 220. The upper substrate 310 may include substantially the same material as the first lower substrate 210. The upper barrier layer 320 may be disposed on the upper substrate 310. The upper barrier layer 320 may include substantially the same material as the lower barrier layer 220. Since the upper substrate 310 and the upper barrier layer 320 are included in the organic light emitting display device 1100, a phenomenon in which metal atoms or impurities are diffused from the outside of the element layer 410 may be prevented and a reliability of the organic light emitting display device 1100 may be improved.

The element layer 410 may be disposed on the upper barrier layer 320. The active pattern, a gate insulating layer covering the active pattern, gate electrodes overlapping the active pattern on the gate insulating layer, an interlayer insulating layer covering the gate electrodes, source electrodes, which is disposed on the interlayer insulating layer, in contact with a source region of the active pattern, drain electrodes, which is disposed on the interlayer insulating layer, in contact with a drain region of the active pattern, and a via insulating layer covering the source electrodes and the drain electrodes may be included in the element layer 410. The active pattern, the gate electrodes, the source electrodes, and the drain electrodes may constitute transistors. The transistors may be turned on or turned off in response to the driving signal generated from the driving circuit D_IC, respectively.

The emission layer 430 may be disposed on the element layer 410. The emission layer 430 may include an anode electrode, an organic light emitting layer disposed on the anode electrode, and a cathode electrode disposed on the organic light emitting layer. As each of the transistors included in the element layer 410 is turned on or turned off, the anode electrode and the cathode electrode may provide a voltage to the organic light emitting layer and the organic light emitting layer may emit light by being provided with the voltage.

The encapsulation layer 450 may be disposed on the emission layer 430. The encapsulation layer 450 may prevent impurities such as moisture and oxygen from penetrating into the emission layer 430. For example, the encapsulation layer 450 may have a structure in which an organic layer and an inorganic layer are alternately arranged.

The touch sensor 500 may be disposed on the encapsulation layer 450. The touch sensor 500 may include a first touch electrode and a second touch electrode forming the touch capacitance together with the first touch electrode. In an example embodiment, the touch sensor 500 may be an on-cell touch sensor embedded in the organic light emitting display device 1100. In this case, at least one of the first and second touch electrodes may be directly formed on the encapsulation layer 450.

The window 610 may be disposed on the touch sensor 500. The window 610 may protect the pressure sensor 100_1, the organic light emitting structure 400, and the touch sensor 500 from impacts applied from the outside. In addition, the window 610 may contact the input unit 2000, and the user pressure may be applied to the window 610 by the input unit 2000. In an example embodiment, the organic light emitting display device 1100 may include the folding area FA. In this case, the window 610 may include a flexible plastic material so that the window 610 is configured to be folded and unfolded in the folding area FA. For example, the window 610 may include polyimide.

In a case that the window 610 includes a plastic material, the window 610 may be easily damaged by the user pressure compared to a window including a glass. For example, when the user pressure greater than the predetermined pressure is applied to the window 610, a shape of the window 610 may be deformed by the user pressure and/or a part of the window 610 may be peeled off. When the window 610 is damaged by the user pressure, the organic light emitting structure 400 may be damaged. However, the organic light emitting display device 1100 according to example embodiments may inform the user when the user pressure is greater than the predetermined pressure. In detail, when the user pressure is greater than the predetermined pressure, the haptic structure 810 may generate the haptic signal, and the organic light emitting display device 1100 may not perform the operation that would be performed if the user pressure were less than or equal to the predetermined pressure, based on the user pressure. Accordingly, the user can reduce the user pressure applied to the organic light emitting display device 1100 of user's own accord. Therefore, the damage to the organic light emitting structure 400, which is due to the user pressure greater than the predetermined pressure, may be prevented.

The support member 700 may be disposed under the lower electrode 110. The support member 700 may support the organic light emitting structure 400. For example, the support member 700 may include a material having a stiffness. For example, the support member 700 may include a metal material such as invar which is alloy of nickel ("Ni") and iron ("Fe"), stainless steel ("SUS"), titanium ("Ti"), copper ("Cu"), and the like. In an example embodiment, the support member 700 may define a plurality of openings overlapping the folding area FA. As the support member 700 defines the openings, the organic light emitting display device 1100 may be easily folded and unfolded. In addition, the openings may prevent wrinkles on an upper surface of the window 610 overlapping the folding area FA.

Figure 9:
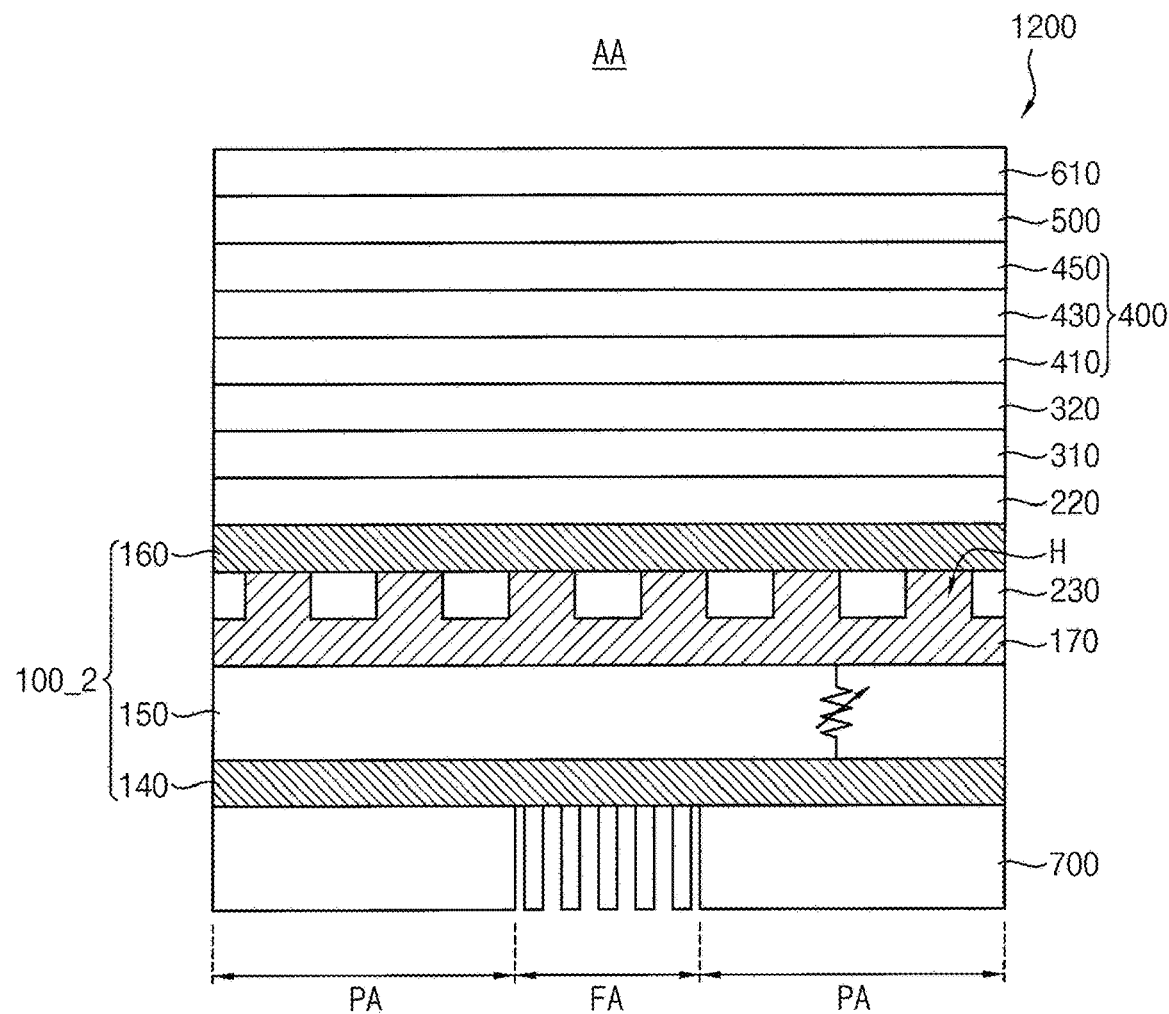
FIG. 9 is a cross-sectional view illustrating another example of an organic light emitting display device included in the electronic device of FIG. 1.
Figure 10:
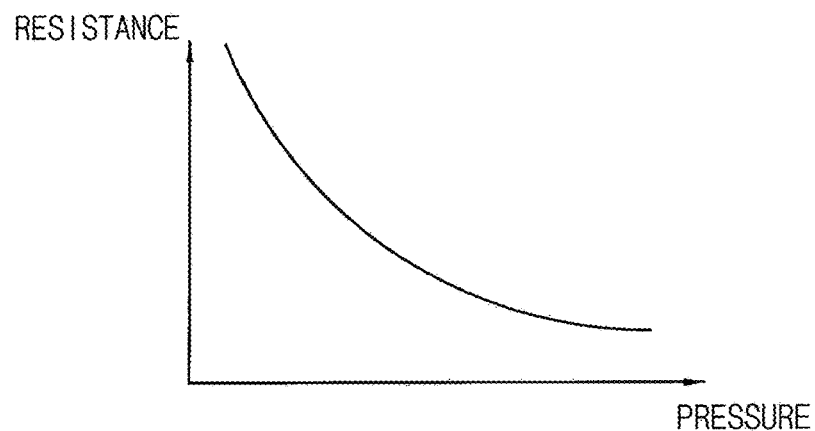
FIG. 10 is a graph for explaining the electrical resistance of the resistance layer against a user pressure.

FIG. 9 is a cross-sectional view illustrating another example of an organic light emitting display device included in the electronic device of FIG. 1. FIG. 10 is a graph for explaining the electrical resistance of the resistance layer against a user pressure.

Referring to FIGS. 1, 2, 3, and 9, an organic light emitting display device 1200 may include a pressure sensor 100_2, an adhesive layer 170, a second lower substrate 230, a lower barrier layer 220, an upper substrate 310, an upper barrier layer 320, an organic light emitting structure 400, a touch sensor 500, a window 610, and a support member 700. The pressure sensor 100_2 may include a lower electrode 140, a resistance layer 150, and an upper electrode 160. The organic light emitting structure 400 may include an element layer 410, an emission layer 430, and an encapsulation layer 450. Since the organic light emitting display device 1200 is substantially the same as the organic light emitting display device 1100 except for the pressure sensor 100_2, the adhesive layer 170, and the second lower substrate 230, the pressure sensor 100_2, the adhesive layer 170, and the second lower substrate 230 will be described in detail below.

The pressure sensor 100_2 may detect the user pressure, which is applied to the window 610, by the input unit 2000. For example, the pressure sensor 100_1 may include the lower electrode 140, the upper electrode 160, and the resistance layer 150 disposed between the lower electrode 140 and the upper electrode 160.

The lower electrode 140 may be disposed on the support member 700. The lower electrode 140 may include a metal, an alloy, a metal nitride, a conductive metal oxide, a transparent conductive material, or the like.

The resistance layer 150 may be disposed on the lower electrode 140. The resistance layer 150 may include a resistant material to form an electrical resistance. The electrical resistance of the resistance layer 150 may change based on a magnitude of the user pressure. In detail, a distance between the upper electrode 160 and the lower electrode 140 may be changed by the user pressure. When the distance between the upper electrode 160 and the lower electrode 140 is changed, a thickness of the resistance layer 150 may be changed. In this case, the electrical resistance of the resistance layer 150 may change according to a degree to which the thickness of the resistance layer 150 is changed. For example, as shown in FIG. 10, as the magnitude of the user pressure increases, the electrical resistance of the resistance layer 150 may decrease. As the magnitude of the user pressure decreases, the electrical resistance of the resistance layer 150 may increase.

In an example embodiment, the resistant material may be a force sensitive material or a force sensitive resistor. For example, the resistant material may include at least one of a QTC (quantum tunneling composite), a piezo-electric material, a carbon powder, silicon, a carbon nanotube, and graphene.

The upper electrode 160 may be disposed on the resistance layer 150. For example, the upper electrode 160 may include substantially the same material as the lower electrode 140.

In an example embodiment, each of the lower electrode 140 and the upper electrode 160 may be the plate shape. In another example embodiment, the lower electrode 140 may include the plurality of auxiliary lower electrodes, and the upper electrode 160 may include the plurality of auxiliary upper electrodes. The auxiliary lower electrodes may extend in the first direction DR1 and be arranged spaced apart in the second direction DR2 intersecting the first direction DR1. The auxiliary upper electrodes may extend in the second direction DR2 and be arranged spaced apart in the first direction DR1, as shown FIG. 7. In still another example embodiment, each of the lower electrode 140 and the upper electrode 160 may be disposed in the matrix shape as shown FIG. 8. In this case, to form the electrical resistance in the resistance layer 150, the lower electrode 140 and the upper electrode 160 may overlap each other in the thickness direction of the resistance layer 150.

The second lower substrate 230 may be disposed between the resistance layer 150 and the upper electrode 160. The second lower substrate 230 may be the transparent or opaque substrate. In addition, the second lower substrate 230 may include at least one of a glass, a quartz, and a plastic material. In an example embodiment, the organic light emitting display device 1200 may include the folding area FA. In this case, the second lower substrate 230 may include a flexible plastic material so that the second lower substrate 230 is configured to be folded and unfolded in the folding area FA. For example, the second lower substrate 230 may include polyimide.

The adhesive layer 170 may be disposed between the resistance layer 150 and the second lower substrate 230. The adhesive layer 170 may include an adhesive material. Accordingly, the second lower substrate 230 may be adhered to the resistance layer 150 by the adhesive layer 170. In addition, in an example embodiment, the second lower substrate 230 may define a plurality of holes, and the adhesive layer 170 may contact the upper electrode 160 through the holes. Accordingly, the adhesive layer 170 may electrically connect the upper electrode 160 and the resistance layer 150. For example, the adhesive layer 170 may be an anisotropic conductive film ("ACF").

Figure 11:
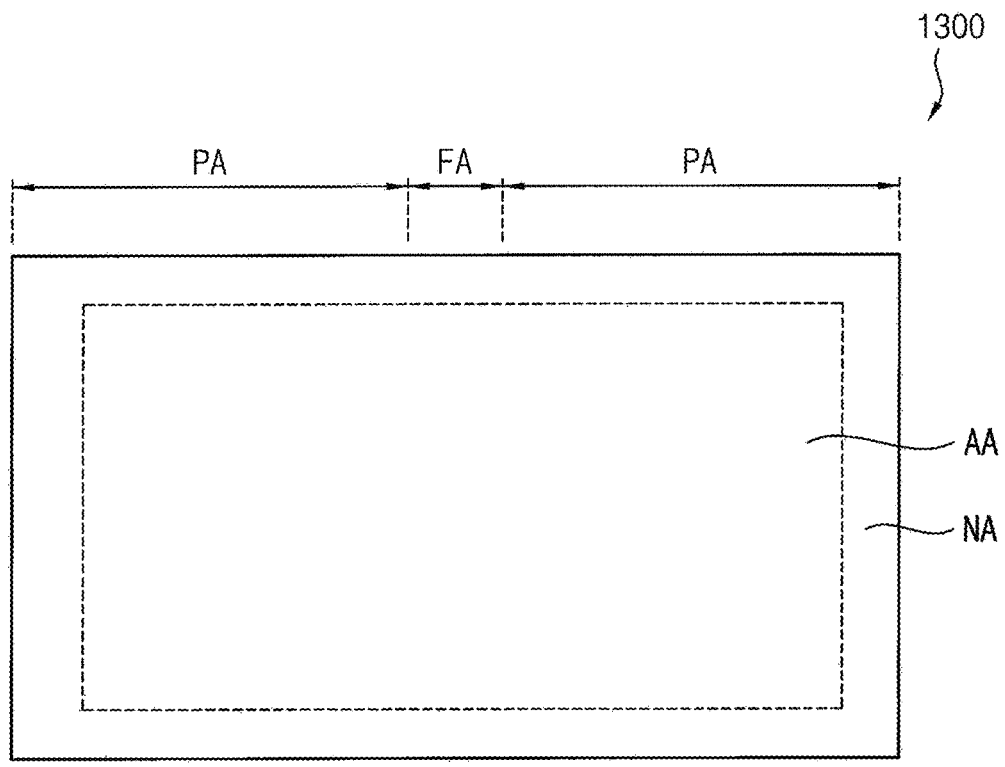
FIG. 11 is a plan view illustrating still another example of an organic light emitting display device included in the electronic device of FIG. 1.
Figure 12:
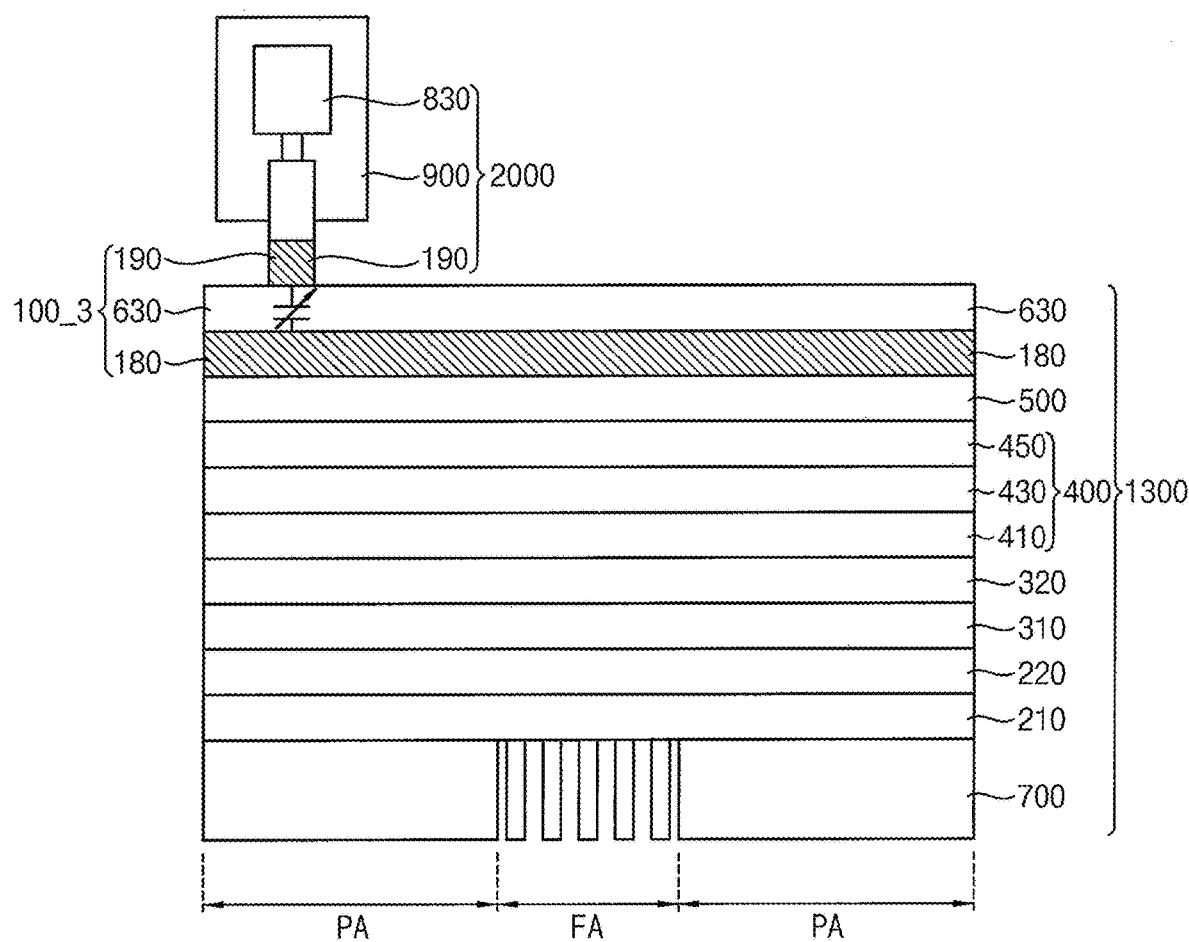
FIG. 12 is a cross-sectional view illustrating the electronic device including the organic light emitting display device of FIG. 11.

FIG. 11 is a plan view illustrating still another example of an organic light emitting display device included in the electronic device of FIG. 1. FIG. 12 is a cross-sectional view illustrating the electronic device including the organic light emitting display device of FIG. 11.

Referring to FIGS. 1, 2, 11, and 12, an electronic device 3000 may include an organic light emitting display device 1300 and the input unit 2000. The user can apply the user pressure using the input unit 2000, and the organic light emitting display device 1300 may perform the operation based on the user pressure applied by the input unit 2000. The input unit 2000 may include any means that the user can use to apply the user pressure. In an example embodiment, the input unit 2000 may be the electrostatic stylus pen that includes an input electrode 190.

The organic light emitting display device 1300 may be divided into the active area AA and the inactive area NA. For example, as shown in FIG. 11, the organic light emitting display device 1300 may be divided into the active area AA and the inactive area NA surrounding the active area AA.

In an example embodiment, the organic light emitting display device 1300 may also be divided into the folding area FA and the flat areas PA. For example, as shown in FIG. 11, the organic light emitting display device 1300 may be divided into the flat areas PA and the folding area FA disposed between the flat areas PA. In an example embodiment, the active area AA may include the folding area FA.

The organic light emitting display device 1300 may include a substrate 210, a barrier layer 220, an organic light emitting structure 400, a touch sensor 500, a transparent electrode 180, a window 630, and a support member 700. The organic light emitting structure 400 may include an element layer 410, an emission layer 430, and an encapsulation layer 450. Since the organic light emitting display device 1300 is substantially the same as the organic light emitting display device 1100 except for the transparent electrode 180 and the window 630, the transparent electrode 180 and the window 630 will be described in detail below.

The transparent electrode 180 may be disposed below the window 630. The transparent electrode 180 may include a metal, an alloy, a metal nitride, a conductive metal oxide, a transparent conductive material, or the like. For example, the transparent electrode 180 may include at least one of indium tin oxide (ITO), indium zinc oxide (IZO), and alloys thereof to transmit light.

The window 630 may be disposed on the transparent sensor 180. The window 630 may protect the organic light emitting structure 400 and the touch sensor 500 from impacts applied from the outside. In addition, the window 630 may contact the input unit 2000, and the user pressure may be applied to the window 630 by the input unit 2000. In an example embodiment, the organic light emitting display device 1300 may include the folding area FA. In this case, the window 630 may include a flexible plastic material so that the window 630 is configured to be folded and unfolded in the folding area FA. For example, the window 630 may include polyimide.

The input unit 2000 may include an input electrode 190, a haptic structure 830, and a body 900. The haptic structure 830 may be disposed in the body 900, and the input electrode 190 may be disposed outside the body 900 to contact the window 630.

The input electrode 190 may include a metal, an alloy, a metal nitride, a conductive metal oxide, a transparent conductive material, or the like. For example, the input electrode 190 may include at least one of gold ("Au"), silver ("Ag"), aluminum ("Al"), platinum ("Pt"), nickel ("Ni"), titanium ("Ti"), palladium ("Pd"), magnesium ("Mg"), calcium ("Ca"), lithium ("Li"), Chromium ("Cr"), tantalum ("Ta"), molybdenum ("Mo"), scandium ("Sc"), neodymium ("Nd"), iridium ("Ir"), tungsten ("W"), tungsten nitride ("WNx"), titanium nitride ("TiNx"), tantalum Nitride ("TaNx"), strontium ruthenium oxide ("SrRuxOy"), zinc oxide ("ZnOx"), indium tin oxide ("ITO"), tin oxide ("SnOx"), indium oxide ("InOx")", gallium oxide ("GaOx"), indium zinc oxide ("IZO") and these alloys.

For example, the transparent electrode 180 may be the pressure driving electrode, and the input electrode 190 may be the pressure sensing electrode. In an example embodiment, the transparent electrode 180 may be provided with the pressure driving signal from the pressure sensing circuit P_IC, and the input electrode 190 may be provided with the ground voltage. When the input unit 2000 contacts the window 630, since a pressure capacitance is formed by the combination of the transparent electrode 180, the input electrode 190, and the window 630, the combination may form a pressure sensor 100_3.

When the user pressure, which is detected by the pressure sensor 100_3, is greater than the predetermined pressure, the haptic structure 830 may generate the haptic signal. In detail, the haptic structure 830 may compare the user pressure and the predetermined pressure. Here, the user pressure is measured through the pressure capacitance formed when the input unit 2000 contacts the window 630. When the user pressure is greater than the predetermined pressure, the haptic structure 830 may generate the haptic signal. The haptic signal may include any signals that can be recognized by the user's sense (e.g., tactile or visual). For example, the haptic signal may be a vibration signal or an optical signal. When the haptic signal is the vibration signal, the haptic structure 830 may cause the body 900 to vibrate. Accordingly, the user may sense the vibration of the body 900.

The electronic device 3000 including the organic light emitting display device 1300 and the input unit 2000 may inform the user when the user pressure is greater than the predetermined pressure. In detail, when the user pressure is greater than the predetermined pressure, the haptic structure 830 may generate the haptic signal. Accordingly, the user can reduce the user pressure applied to the organic light emitting display device 1300 of user's own accord. Therefore, the damage to the organic light emitting structure 400, which is due to the user pressure greater than the predetermined pressure, may be effectively prevented.

Figure 13:
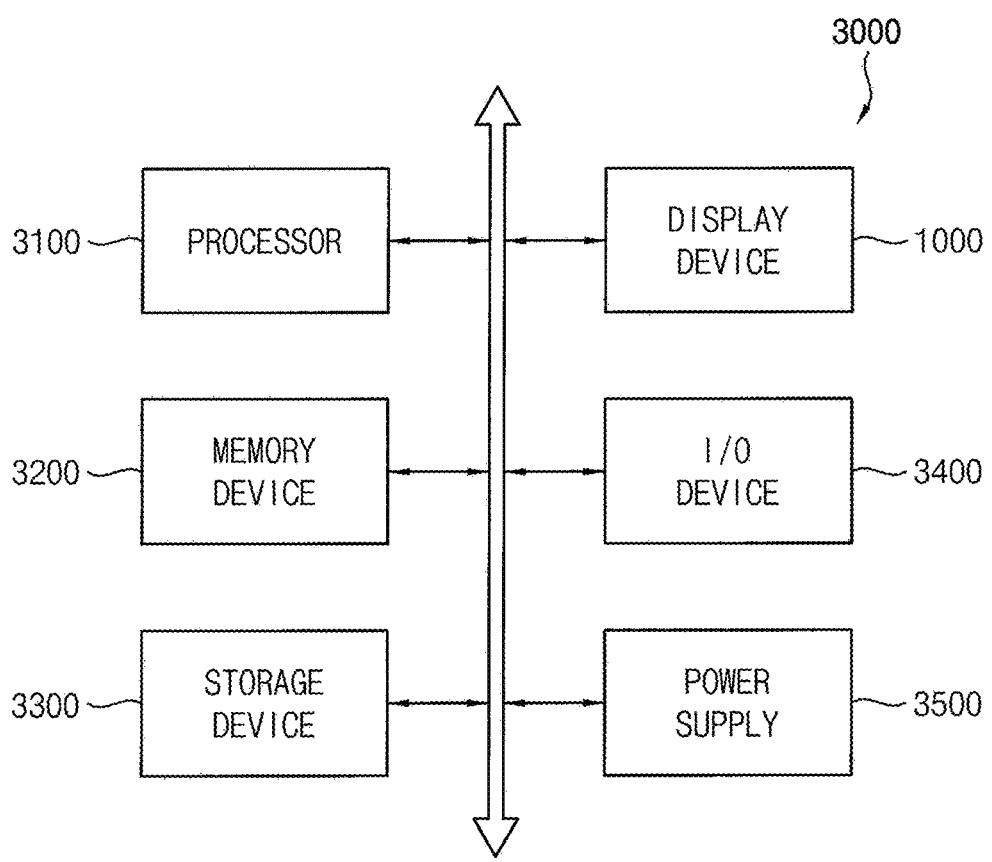
FIG. 13 is a block diagram illustrating the electronic device of FIG. 1.

FIG. 13 is a block diagram illustrating the electronic device of FIG. 1.

Referring to FIG. 13, an electronic device 3000 may include a processor 3100, a memory device 3200, a storage device 3300, an input/output ("I/O") device 3400, a power supply 3500, and the organic light emitting display device 1000. The electronic device 3000 may further include a plurality of ports for communicating a video card, a sound card, a memory card, a universal serial bus ("USB") device, other electric devices, etc.

The processor 3100 may perform various computing functions or tasks. The processor 3100 may be an application processor ("AP"), a micro processor, a central processing unit ("CPU"), etc. The processor 3100 may be coupled to other components via an address bus, a control bus, a data bus, etc. Further, in some example embodiments, the processor 3100 may be further coupled to an extended bus such as a peripheral component interconnection ("PCI") bus.

The memory device 3200 may store data for operations of the electronic device 3000. For example, the memory device 3200 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc, and/or at least one volatile memory device such as a dynamic random access memory ("DRAM") device, a static random access memory ("SRAM") device, a mobile dynamic random access memory (mobile DRAM) device, etc.

The storage device 3300 may be a solid state drive ("SSD") device, a hard disk drive ("HDD") device, a CD-ROM device, etc. The I/O device 3400 may be an input device such as a keyboard, a keypad, a mouse, a touch screen, etc, and an output device such as a printer, a speaker, etc. The power supply 3500 may supply power for operations of the electronic device 3000.

According to example embodiments, the electronic device 3000 may be any electronic device including the organic light emitting display device 1000, such as a cellular phone, a smart phone, a tablet computer, a wearable device, a personal digital assistant ("PDA"), a portable multimedia player ("PMP"), a digital camera, a music player, a portable game console, a navigation system, a digital television, a 3D television, a personal computer ("PC"), a home appliance, a laptop computer, etc.

The present inventive concept may be applied to a display device and an electronic device using the display device. For example, the present inventive concept may be applied to a cellular phone, a smart phone, a video phone, a smart pad, a smart watch, a tablet PC, a car navigation system, a television, a computer monitor, a laptop, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
a lower electrode;
a pressure sensing layer disposed on the lower electrode;
an upper electrode disposed on the pressure sensing layer;
an organic light emitting structure disposed on the upper electrode;
a window disposed on the organic light emitting structure and which is applied with a user pressure;
a haptic structure which generates a haptic signal when the user pressure detected through the lower electrode, the pressure sensing layer, and the upper electrode is greater than a predetermined pressure;
a lower substrate disposed between the pressure sensing layer and the upper electrode;
a lower barrier layer disposed on the upper electrode;
an upper substrate disposed on the lower barrier layer; and
an upper barrier layer disposed on the upper substrate,
wherein the window includes a plastic material and is flexible.

2. The organic light emitting display device of claim 1, wherein the pressure sensing layer is a dielectric layer including a dielectric material.

3. The organic light emitting display device of claim 2, further comprising:
a first lower substrate disposed between the dielectric layer and the upper electrode, and
wherein the first lower substrate is adhered to the lower electrode using the dielectric material included in the dielectric layer.

4. The organic light emitting display device of claim 2, wherein a capacitance is generated in the dielectric layer by the lower electrode and the upper electrode, and
wherein the capacitance changes based on a magnitude of the user pressure applied to the window.

5. The organic light emitting display device of claim 4, wherein each of the upper and lower electrodes has a plate shape.

6. The organic light emitting display device of claim 4, wherein the lower electrode includes a plurality of auxiliary lower electrodes extending in a first direction and arranged spaced apart in a second direction intersecting the first direction, and
wherein the upper electrode includes a plurality of auxiliary upper electrodes extending in the second direction and arranged spaced apart in the first direction.

7. The organic light emitting display device of claim 4, wherein each of the upper and lower electrodes is disposed in a matrix shape.

8. The organic light emitting display device of claim 7, wherein the lower electrode and the upper electrode overlap each other in a thickness direction of the dielectric layer.

9. The organic light emitting display device of claim 1, wherein the pressure sensing layer is a resistance layer including a resistant material, and
wherein an electrical resistance of the resistant material changes based on a magnitude of the user pressure.

10. The organic light emitting display device of claim 9, further comprising:
a second lower substrate disposed between the resistance layer and the upper electrode and defining a plurality of holes; and
an adhesive layer disposed between the second lower substrate and the resistance layer.

11. The organic light emitting display device of claim 10, wherein the adhesive layer contacts the upper electrode through the holes.

12. The organic light emitting display device of claim 10, wherein the adhesive layer is an anisotropic conductive film.

13. The organic light emitting display device of claim 9, wherein the electrical resistance of the resistance layer decreases, as the magnitude of the user pressure applied to the window increases, and
wherein the electrical resistance of the resistance layer increases, as the magnitude of the user pressure applied to the window decreases.

14. The organic light emitting display device of claim 13, wherein the resistant material is a quantum tunneling composite (QTC).

15. The organic light emitting display device of claim 1, further comprising:
a touch sensor disposed on the organic light emitting structure and which detects a touch pressure applied to the window.

16. An electronic device comprising an organic light emitting display device and an input unit,
wherein the organic light emitting display device comprises:
a substrate;
an organic light emitting structure disposed on the substrate;
a transparent electrode disposed on the organic light emitting structure; and
a window disposed on the transparent electrode and which is applied with a user pressure by the input unit,
wherein the input unit comprises:
an input electrode which contacts the window; and
a haptic structure,
wherein the haptic structure generates a haptic signal when the user pressure, which is detected through the transparent electrode, the window, and the input electrode, is greater than a predetermined pressure, and
wherein a capacitance is generated in the window by the transparent electrode and the input electrode, and
wherein the capacitance changes based on a magnitude of the user pressure applied to the window.

* * * * *